(12) United States Patent
Sekiguchi

(10) Patent No.: US 6,534,868 B2
(45) Date of Patent: Mar. 18, 2003

(54) SEMICONDUCTOR DEVICE AND METHOD FOR FABRICATING THE SAME

(75) Inventor: Mitsuru Sekiguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/986,289

(22) Filed: Nov. 8, 2001

(65) Prior Publication Data

US 2002/0047207 A1 Apr. 25, 2002

Related U.S. Application Data

(62) Division of application No. 09/137,150, filed on Aug. 20, 1998, now Pat. No. 6,333,255.

(30) Foreign Application Priority Data

Aug. 21, 1997 (JP) .............................. 9-224987

(51) Int. Cl.[7] .................. H01L 23/48; H01L 23/52; H01L 29/40

(52) U.S. Cl. ................ 257/758; 257/759; 257/760; 257/522

(58) Field of Search .............. 257/758, 759, 257/760, 522, 750; 438/622, 623, 624, 118, 319, 619, 739, 740, 421, 422

(56) References Cited

U.S. PATENT DOCUMENTS

| 4,933,743 A | 6/1990 | Thomas et al. |
| 5,117,276 A | 5/1992 | Thomas et al. |
| 5,324,683 A | 6/1994 | Fitch et al. |
| 5,468,685 A | 11/1995 | Orisaka et al. |
| 5,485,038 A | * 1/1996 | Licari et al. .................. 257/758 |
| 5,530,290 A | 6/1996 | Aitken et al. |
| 5,559,055 A | 9/1996 | Chang et al. |
| 5,567,982 A | 10/1996 | Bartelink |
| 5,798,559 A | 8/1998 | Bothra et al. |
| 5,900,668 A | 5/1999 | Wollesen |
| 5,923,074 A | 7/1999 | Jeng |
| 5,950,102 A | 9/1999 | Lee |
| 5,994,776 A | 11/1999 | Fang et al. |
| 6,064,118 A | 5/2000 | Sasaki |

FOREIGN PATENT DOCUMENTS

| EP | 000491543 A2 | * 6/1992 | ................ 257/758 |
| JP | 61-107746 | 5/1986 | |
| JP | 405036756 A | * 2/1993 | ................ 257/758 |
| JP | 06-085070 | 3/1994 | |
| JP | 08-017918 | 1/1996 | |
| JP | 8-250592 | 9/1996 | |
| JP | 09-172068 | 6/1997 | |
| JP | 10-199978 | 7/1998 | |
| JP | 10-294316 | 11/1998 | |

OTHER PUBLICATIONS

T. Hasegawa et al., "Possiblity of Organic Film for 0.13$\mu$m Rule Time", Semiconductor World, pp. 89–93, Feb., 1996.
M.B. Anand, et al., "NURA: A Feasible, Gas–Dielectric Interconnect Process", 1996 IEEE Symposium on VLSI Technology Digest of Technical Papers, pp. 82–83, 1996.

* cited by examiner

*Primary Examiner*—Phat K. Cao
*Assistant Examiner*—Theresa T. Doan
(74) *Attorney, Agent, or Firm*—McDermott, Will & Emery

(57) ABSTRACT

A lower carbon film as a provisional film, a lower $SiO_2$ film and an upper carbon film are formed, and then trenches having a wiring pattern are formed in the upper carbon film. Next, contact holes are formed through the lower carbon film and the lower $SiO_2$ film. Then, wires and plugs are formed by filling in the trenches and contact holes with a barrier metal film and a Cu alloy film. After these process steps are repeatedly performed several times, a dummy opening is formed to extend downward through the uppermost $SiO_2$ film. Thereafter, the carbon films are removed by performing ashing with oxygen introduced through the dummy opening. As a result, gas layers are formed to surround the wires and plugs. In this manner, a highly reliable gas-dielectric interconnect structure can be obtained by performing simple process steps.

4 Claims, 10 Drawing Sheets

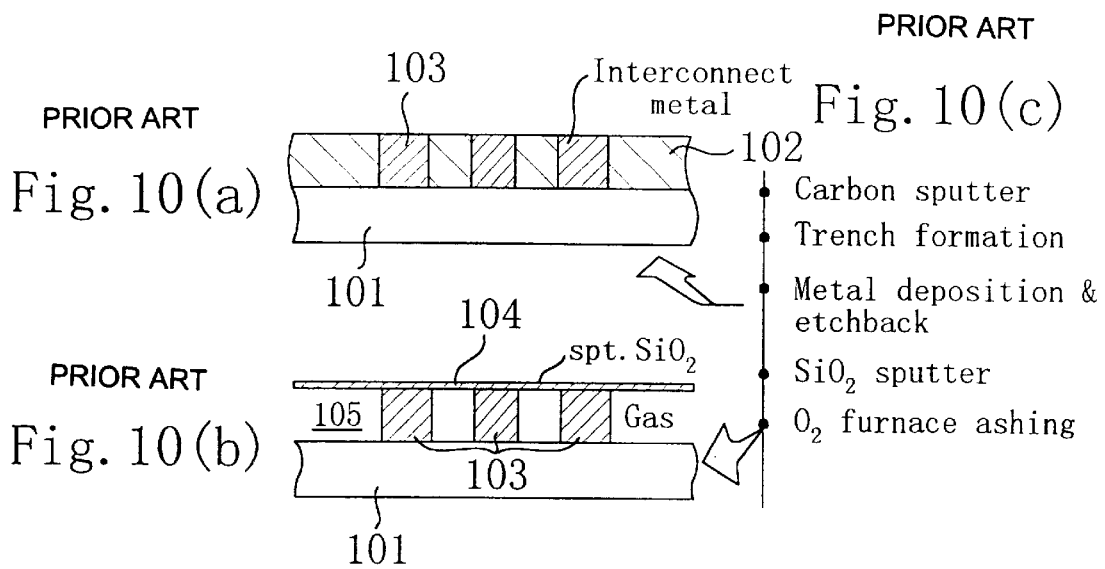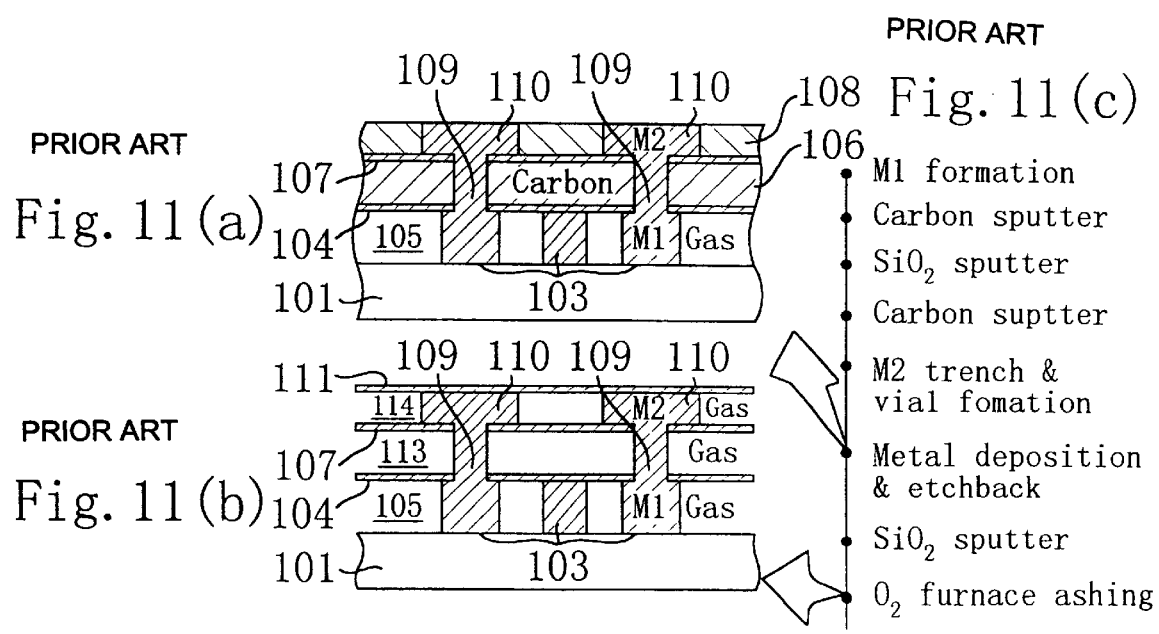

SEMICONDUCTOR DEVICE AND METHOD FOR FABRICATING THE SAME

This application is a divisional of application Ser. No. 09/137,150 filed Aug. 20, 1998, now U.S. Pat. No. 6,333,255.

BACKGROUND OF THE INVENTION

The present invention generally relates to a semiconductor device having a multilevel interconnect structure and a method for fabricating the same, and more particularly relates to techniques for reducing wiring delay.

Currently, the size of a transistor goes on being decreased day by day. It has already been shown that, in transistors for silicon LSI's belonging to the size generation of 0.07 μm or more, in particular, if 1/k scaling is realized in the lateral direction, the speed thereof can be increased by 1/k.

On the other hand, in multilevel interconnect technology, the contribution of wire-to-wire capacitance is significant if the sizes belong to the generation of about 0.5 μm or more. Thus, it has already been shown that even if 1/k scaling is realized in the lateral direction, the wiring delay thereof is reduced by no more than $1/k^{2-a}$, where a is a coefficient having a value from 1 to 2.

In view of the state in the art, a scaling rule for reducing the wiring delay by approximately the same degree as 1/k was suggested. In accordance with the scaling rule, the thickness of a wire is scaled down to $1/k^{2/3}$, the thickness of an interlayer dielectric film to $1/k^{1/2}$, the relative dielectric constant of the interlayer dielectric film to $1/k^{1/3}$ and the specific resistance of the wire to $1/k^{1/3}$. However, if this scaling rule must be obeyed, the relative dielectric constants of materials for an interlayer dielectric film should be decreased to be 3.5, 3.1, 2.8, 2.4 and 1.9 for the 0.35 μm-generation, 0.25 μm-generation, 0.18 μm-generation, 0.13 μm-generation and 0.10 μm-generation, respectively.

The relative dielectric constant of a silicon dioxide film, which is widely used as an interlayer dielectric film, is about 4. Thus, so long as this scaling rule must be complied with, a silicon dioxide film can no longer be applied for the generations of 0.35 μm or less. Among various organic low-dielectric-constant films under development, an HSQ film (2.2), a Teflon-AF film (1.9) and the like have smallest dielectric constants. If the air having a relative dielectric constant of 1 could be used as an alternative to an insulating film, then the speed of a CMOS device with a design rule of 0.35 μm could be further increased by about 33% as compared with the case of using an HSQ film, for example.

Accordingly, it is considered that the above described various problems might be solved by employing a gas-dielectric interconnect process for disposing wires between the wire-to-wire gaps filled with a gas.

Hereinafter, an exemplary application of a gas-dielectric interconnect process for trench interconnection (suggested by M. B. Anand et al., VLSI Symposium 1996, p. 82) will be described with reference to the drawings.

FIGS. 10(a) and 10(b) are cross-sectional views illustrating a conventional single-damascene gas-dielectric interconnect process, while FIG. 10(c) is a process flow chart thereof. FIGS. 11(a) and 11(b) are cross-sectional views illustrating a conventional dual-damascene gas-dielectric interconnect process, while FIG. 11(c) is a process flow chart thereof. The two types of semiconductor device structures to be formed in accordance with the respective processes will be described below with reference to the process flow charts of FIGS. 10(c) and 11(c).

First, the single-damascene gas-dielectric interconnect process will be described. In the process step shown in FIG. 10(a), a carbon film 102 is formed on a substrate 101 by sputtering, and trenches are formed in the carbon film 102. Then, a metal film is deposited over the entire surface of the substrate and etched-back, thereby forming a metal interconnect layer 103 so as to fill in the trenches.

Next, in the process step shown in FIG. 10(b), a thin silicon dioxide film 104 is formed over the substrate and then the carbon film 102 is burned to be ashed in a furnace at a temperature from 400° C. to 450° C. while supplying $O_2$ gas thereto. As a result, the gaps between the wires in the interconnect layer 103 form a gas layer 105.

Then, a carbon film is deposited over the entire surface of the substrate and a metal film is deposited so as to fill in the via-holes formed in the carbon film, thereby forming plugs to be connected to the respective wires. Thereafter, the process returns to the step shown in FIG. 10(a) and a similar process is repeatedly performed to remove the surrounding carbon film.

In this way, by repeatedly performing the process steps shown in FIGS. 10(a) and 10(b) and the subsequent process step of forming plugs, a gas-dielectric interconnect structure, in which gas layers exist between multilevel interconnects, can be formed.

On the other hand, the dual-damascene gas-dielectric interconnect process is performed in the following manner.

At the outset of the process step shown in FIG. 11(a), the steps shown in FIGS. 10(a) and 10(b) have already been performed to form the (lower) interconnect layer 103, in which wires are surrounded by the gas layer 105, and the (lower) silicon dioxide film 104 on the substrate 101. In such a state, a carbon film 106 is formed by sputtering over the entire surface of the substrate, a thin silicon dioxide film 107 is deposited thereon, and another carbon film 108 is further deposited thereon. Then, trenches are formed through the carbon film 108 and via-holes are formed through the silicon dioxide film 107 and the carbon film 106. Thereafter, a metal film is deposited over the entire surface of the substrate and etched-back, thereby forming metal plugs 109 and an upper metal interconnect layer 110 so as to fill in the via-holes and the trenches simultaneously.

Next, in the process step shown in FIG. 11(b), a thin silicon dioxide film 111 is formed over the substrate and the two carbon films 106 and 108 are burned to be ashed at a temperature from 400° C. to 450° C. while supplying $O_2$ gas thereto. As a result, gas layers 113 and 114 are formed to surround the plugs 109 and the wires in the upper interconnect layer 110.

That is to say, by interposing gas layers as alternatives to low-dielectric-constant films, a multilevel interconnect structure contributing to the reduction of parasitic capacitance is formed.

However, in accordance with the processes shown in FIGS. 10(a) and 10(b) and FIGS. 11(a) and 11(b), the thicknesses of the silicon dioxide films 104, 107, 111 should be sufficiently small such that oxygen can be sequentially permeated downward during ashing and removal of the carbon films 102, 106, 108 within an oxygen ambient at about 450° C. in the process steps shown in FIGS. 10(b) and 11(b). Then, the silicon dioxide films cannot show sufficient strength for supporting the respective wires, and therefore the reliability is adversely deteriorated.

In addition, the procedures of repeatedly depositing carbon films, silicon dioxide films and metal films and repeatedly ashing the carbon films to be removed are so complicated that the process efficiency is unsatisfactory.

On the other hand, in order to reduce the specific resistance of a wire and thereby reduce the wiring delay, it is considered that Cu wires should naturally replace Al wires. However, since it is difficult to form Cu wires by dry etching, the steps shown in FIGS. 10(a) and 10(b) and FIGS. 11(a) and 11(b), in which trenches and holes are formed beforehand and then Cu is filled therein, have been taken. As a specific alternative procedure of such a method, a reflow process, in which a Cu film is deposited by sputtering and then made to flow and injected into trenches and holes within a hydrogen ambient at a temperature from 400 to 500° C., is now under development and expected to be used widely. However, since a currently developed a low-dielectric-constant film (e.g., a film having a relative dielectric constant of 2.8 or less) has thermal resistance as low as 400° C. or less, the low-dielectric-constant film itself possibly flows. Thus, it is difficult to use such a film with the reflow technology for forming Cu wires. That is to say, the reduction in resistance of wires is undesirably limited by the thermal resistance of such a low-dielectric-constant film.

SUMMARY OF THE INVENTION

In view of the above-described problems, the present invention was made to accomplish a primary object of providing a highly reliable semiconductor device with the strength of the interconnect structure thereof enhanced, and a method for efficiently fabricating such a semiconductor device while utilizing fundamental techniques for forming a gas-dielectric interconnect structure.

A secondary object of the present invention is providing a semiconductor device having an interconnect structure that uses a low-dielectric-constant film having low thermal resistance as an interlayer dielectric film and still can sufficiently resist to a heat treatment required for forming trench-filling wires having low resistance, and a method for fabricating the same.

A first semiconductor device according to the present invention includes: a semiconductor substrate; a plurality of interconnect layers disposed at respectively different levels above the semiconductor substrate, each said interconnect layer including a plurality of wires; a plurality of plugs, each said plug vertically connecting an associated wire in one of the interconnect layers to the semiconductor substrate or vertically connecting a pair of wires to each other, the pair of wires belonging to two mutually different ones of the interconnect layers; a plurality of insulating films provided for the respective interconnect layers, each said insulating film being in contact with the respective wires belonging to the same one of the interconnect layers and laterally connecting the wires to each other; and an opening provided to pass through at least the uppermost one of the insulating films. Regions immediately under each said insulating film, through which the opening is formed, form a gas layer, and regions overlying the regions immediately under each said insulating film and surrounding the wires and the plugs also form a gas layer.

In this structure, regions immediately under each said insulating film, through which the opening is formed, form a gas layer, and regions overlying the regions immediately under each said insulating film and surrounding the wires and the plugs also form a gas layer. Thus, while the semiconductor device is used normally, the semiconductor device has a so-called "gas-dielectric interconnect structure" in which the air having a relative dielectric constant of approximately 1 functions as an insulating film between adjacent wires. Since the opening is provided in this manner, the film, which is interposed between adjacent insulating films for forming gas layers, can be removed easily during the formation of a semiconductor device. Thus, it is no longer necessary to reduce the thickness of an insulating film to such a value as to make the film penetrate oxygen, as has conventionally been done. Accordingly, a thick insulating film can be formed. Consequently, not only wiring delay can be reduced as is specific to a gas-dielectric interconnect structure, but also the overall strength of the multilevel interconnect structure can be increased and the reliability of the structure can be improved. Moreover, since the opening is provided, the gas layer between adjacent wires can be an opened gas layer. Thus, the damage, which has conventionally been done on the respective members because of the expansion and compression of the gas layers during heating and cooling of a semiconductor device, can be reduced, thereby improving the reliability of the semiconductor device. In other words, the first object of the present invention is accomplished.

In one embodiment, a pair of said insulating films are preferably provided for each said interconnect layer so as to come into contact with the upper and lower surfaces of the wires in each said interconnect layer.

In such a case, the wires can be strongly interconnected to each other via the insulating film.

If another embodiment, coating insulating films may be further formed on exposed surfaces of the wires and the plugs.

In such a case, even if moisture or humidity permeates the gas layers during the operation of the semiconductor device, the electrical shortcircuit of the wires and the disconnection thereof owing to erosion can be prevented. As a result, an even more reliable interconnect structure can be obtained.

A second semiconductor device according to the present invention includes: a semiconductor substrate; a plurality of interconnect layers disposed at respectively different levels above the semiconductor substrate, each said interconnect layer including a plurality of wires; a plurality of plugs, each said plug vertically connecting an associated wire in one of the interconnect layers to the semiconductor substrate or vertically connecting a pair of wires to each other, the pair of wires belonging to two mutually different ones of the interconnect layers; a plurality of first insulating films provided for the respective interconnect layers, each said first insulating film being in contact with the respective wires belonging to the same one of the interconnect layers and laterally connecting the wires to each other; and an opening provided to pass through at least the uppermost one of the first insulating films. Regions immediately under each said insulating film, through which the opening is formed, and regions overlying the regions immediately under each said insulating film and surrounding the wires and the plugs are filled with a low-dielectric-constant film having a relative dielectric constant of 2.8 or less.

In this structure, regions immediately under each said insulating film, through which the opening is formed, and regions overlying the regions immediately under each said insulating film and surrounding the wires and the plugs are filled with a low-dielectric-constant film having a relative dielectric constant of 2.8 or less. Thus, such a structure has a higher strength than that of a gas-dielectric interconnect structure and can considerably reduce wiring delay. In addition, even though a low-dielectric-constant film, having generally low thermal resistance, is used as an insulating film between adjacent wires, an insulating material for the low-dielectric-constant film can be easily introduced through the opening. Thus, when an interconnect layer is formed, it is possible to take a procedure, in which a gas layer is formed first and then a low-dielectric-constant material is introduced into the gas layer. That is to say, before the gas layers are formed, this structure can be subjected to a heat treatment or the like without being limited by the thermal resistance of the low-dielectric-constant film. Accordingly, wires having low resistance, made of a Cu alloy film, for example, can be provided.

A method for fabricating a semiconductor device according to the present invention includes the steps of: a) forming a plurality of interconnect layers by sequentially stacking plugs and wires on a substrate, and forming an insulating film and a provisional film for each said interconnect layer, the insulating film laterally interconnecting the wires to each other, the provisional film filling in regions surrounding the plugs and the wires; b) forming an opening through at least the uppermost one of the insulating films and the uppermost one of the provisional films that are formed in the step a); and c) removing the provisional films while leaving the insulating films, thereby turning at least part of the regions where the provisional films existed into gas layers.

In accordance with this method, since the opening can be provided in the step b), gas or liquid for removing the provisional films can be introduced easily through the opening in the step c). The gas, liquid or the like used for the removal process can also be easily exhausted through the opening. Thus, unlike a conventional method for forming a gas-dielectric interconnect structure, it is no longer necessary to reduce the thickness of an insulating film to such a value as to make the film penetrate oxygen. As a result, it is possible to fabricate a semiconductor device having wires that are strongly interconnected via thick insulating films. In addition, since the provisional films can be removed by performing only one step, the number of process steps can be reduced. As a result, a semiconductor device having a gas-dielectric interconnect structure can be fabricated at a lower cost.

In one embodiment, the step a) may be performed by repeating several times the sub-steps of: i) forming a first provisional film on the substrate; ii) forming through holes in the first provisional film; iii) forming the plugs out of a conductive material to fill in the through holes; iv) forming a second provisional film over the substrate after the sub-step iii) has been performed; v) forming trenches having a wiring pattern in the second provisional film; vi) forming the wires out of a conductive material to fill in the trenches; and vii) forming an insulating film over the substrate after the sub-step vi) has been performed.

In accordance with this method, a gas-dielectric interconnect structure can be obtained by utilizing a trenched interconnect structure to be formed by a so-called "single-damascene process".

In another embodiment, the step a) may be performed by repeating several times the sub-steps of: i) forming a provisional film over a semiconductor substrate; ii) forming trenches and through holes in the provisional film, each said through hole extending downward from the bottom of an associated one of the trenches and passing through the provisional film; iii) forming the wires out of a conductive material to fill in the trenches and the plugs out of the conductive material to fill in the through holes; and iv) forming an insulating film over the substrate so as to come into contact with the wires after the sub-step iii) has been performed.

In accordance with this method, a gas-dielectric interconnect structure including trench-filling wires can be formed by performing simpler process steps utilizing a so-called "dual-damascene process".

In still another embodiment, the step a) may be performed by repeating several times the sub-steps of: i) forming a provisional film over a semiconductor substrate; ii) forming through holes in the provisional film; iii) forming the plugs out of a conductive material to fill in the through holes, and the wires to be connected to the plugs and to extend upward through the provisional film; and iv) forming an insulating film over the substrate between the sub-steps i) and ii) and/or after the sub-step iii) has been performed.

In accordance with this method, a semiconductor device having a gas-dielectric interconnect structure can be obtained by utilizing the multilevel interconnects formed by etching and patterning processes generally employed.

In still another embodiment, in the step a), a carbon film is preferably formed as the provisional film, and in the step c), the carbon film is preferably removed by ashing with oxygen.

In still another embodiment, the step a) further includes the sub-step of forming an intermediate insulating film in the middle of the provisional film, the intermediate insulating film functioning as an etching stopper for forming the trenches. In such a case, the accuracy of the resulting wiring pattern can be improved.

In still another embodiment, in the step a), the provisional film may be made of a material having a high etch selectivity with respect to the insulating film, and in the step c), the provisional film may be removed by isotropic etching.

In still another embodiment, the method may further include the step of forming a coating insulating film on exposed surfaces of the wires and the plugs by introducing an insulating material into the gas layers through at least the opening after the step c) has been performed.

In such a case, it is possible to fabricate a semiconductor device, in which electrical shortcircuit between conductive regions exposed in the gas layer and the disconnection thereof can be prevented with more certainty.

In still another embodiment, the method may further include the step of forming a low-dielectric-constant film by introducing an insulating material into the gas layers through at least the opening and thereby filling in the gas layers with a material having a lower dielectric constant than that of the insulating film, after the step c) has been performed.

In such an embodiment, the method preferably further includes the step of connecting bonding wires to the wires in the uppermost one of the interconnect layers after the step c) has been performed and before the step of forming the low-dielectric-constant film is performed. In the step of forming the low-dielectric-constant film, the low-dielectric-constant film is preferably formed so as to cover connection portions between the wires in the uppermost interconnect layer and the bonding wires.

BRIEF DESCRIPTION OF THE DRAWINGS

FIGS. 10(a) and 10(b) are cross-sectional views illustrating a procedure for forming a gas-dielectric interconnect structure in accordance with a conventional single-damascene process, and FIG. 10(c) is a process flow chart thereof.

FIGS. 11(a) and 11(b) are cross-sectional views illustrating a procedure for forming a gas-dielectric interconnect structure in accordance with a conventional dual-damascene process, and FIG. 11(c) is a process flow chart thereof.

DESCRIPTION OF THE PREFERRED EMBODIMENTS

Embodiment 1

Hereinafter, a method for fabricating a semiconductor device of the first embodiment will be described with reference to FIGS. 1(a) through 1(d).

Figure 1A:
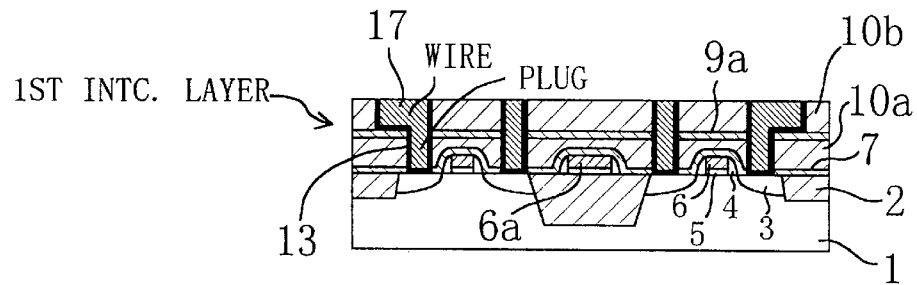
FIGS. 1(a) through 1(d) are cross-sectional views illustrating the respective process steps for fabricating a semiconductor device having a gas-dielectric interconnect structure by using carbon films and $SiO_2$ films in the first embodiment of the present invention.

First, in the process step shown in FIG. 1(a), trench isolation regions 2 are formed in a P-type silicon substrate 1. Then, MOS transistors, each including source/drain regions 3, sidewalls 4, a gate oxide film 5, a gate electrode 6 and a gate wire 6a, are formed on the substrate. A substrate coating 7, made of $SiO_2$, is deposited thereon to cover the gate electrodes 6, the gate wires 6a, the silicon substrate 1 and the like. And a lower carbon film 10a as a provisional film, in which plugs are to be formed, a lower $SiO_2$ film 9a, and an upper carbon film 10b as a provisional film, in which wires are to be formed, are sequentially deposited thereon. Next, trenches for wiring are formed in the upper carbon film 10b by using the lower $SiO_2$ film 9a as a stopper. Then, contact holes, each extending from the bottom of a trench to reach the source/drain regions 3 through the lower $SiO_2$ film 9a and the lower carbon film 10a, are opened. Alternatively, the trenches for wiring may be formed after the contact holes have been formed. Subsequently, a barrier metal film and a Cu alloy film are deposited over the entire surface of the substrate by sputtering and then the Cu alloy film is subjected to a heat treatment at a temperature from 400° C. to 500° C. and made to reflow, thereby filling in the trenches for wiring and contact holes with the Cu alloy. Alternatively, a Cu alloy film may be formed by a plating technique. Thereafter, the surface of the alloy film is planarized by CMP (chemical mechanical polishing), thereby removing the deposited barrier metal and Cu alloy films except for the portions filled in the trenches for wiring and contact holes. As a result, portions of the barrier metal film 13 and Cu alloy film 17, which are left in the trenches for wiring formed in the upper provisional film 10b, function as the wires of the first interconnect layer. On the other hand, portions of the barrier metal film 13 and Cu alloy film 17, which are left in the contact holes formed in the lower provisional film 10a, function as plugs for vertically connecting the wires in the first interconnect layer to the source/drain regions 3.

Figure 1B:
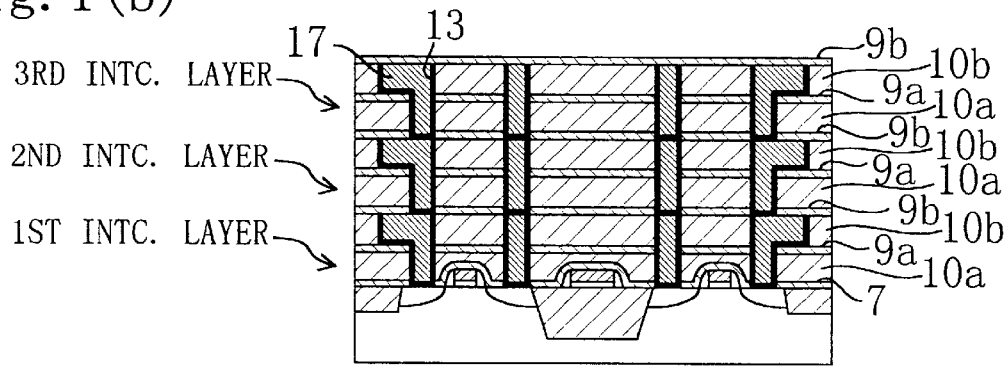

Next, in the process step shown in FIG. 1(b), deposition of the upper $SiO_2$ film 9b, lower carbon film 10a, lower $SiO_2$ film 9a and upper carbon film 10b; formation of the trenches for wiring and contact holes; deposition and reflowing of the barrier metal film 13 and Cu alloy film 17; and planarizing by CMP are repeated several times, thereby forming wires and plugs for the second and third interconnect layers. As the uppermost layer, an upper $SiO_2$ film 9b, also functioning as a protective film, is deposited.

Figure 1C:
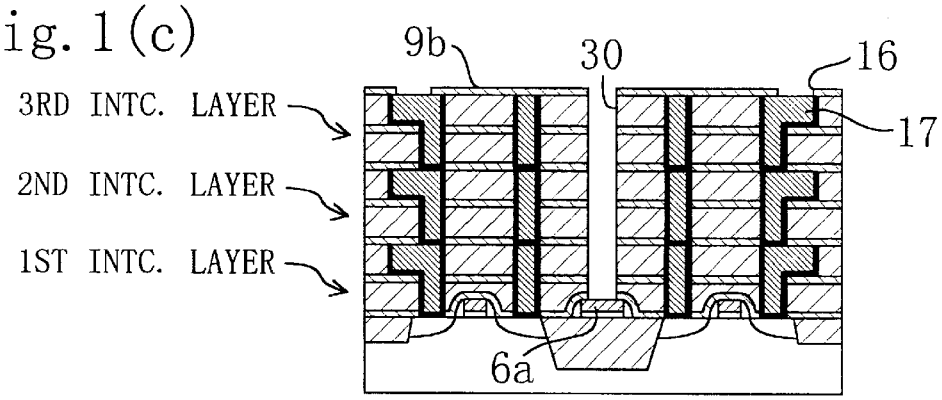

Then, in the process step shown in FIG. 1(c), openings 16 are formed in the uppermost $SiO_2$ film 9b, thereby exposing pad portions of the Cu alloy film 17 functioning as the wires in the third interconnect layer (the uppermost interconnect layer). Also, a dummy opening 30 is formed to pass through multiple carbon films 10a, 10b, multiple $SiO_2$ films 9a, 9b and the substrate coating 7 and to reach the gate wire 6a over the trench isolation region 2.

Figure 1D:
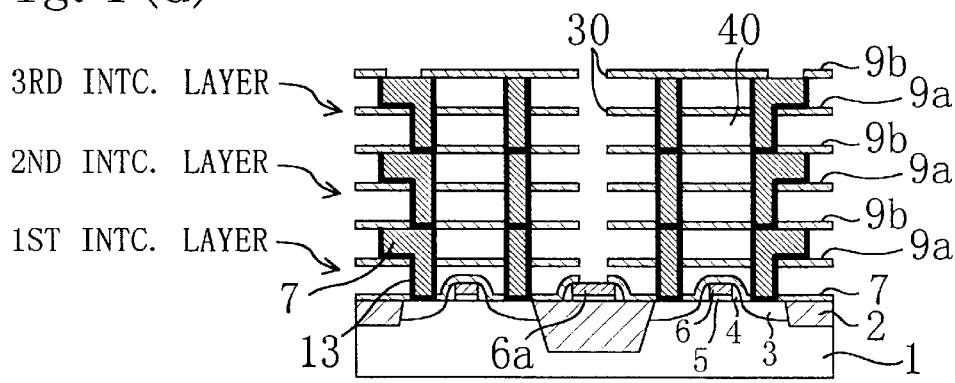

Subsequently, in the process step shown in FIG. 1(d), the carbon films 10a, 10b are removed by ashing with oxygen (e.g., oxygen plasma). As a result, gas layers 40 are formed between the wires, each consisting of the barrier metal film 13 and the Cu alloy film 17. In this manner, a semiconductor device having a so-called "gas-dielectric interconnect structure" can be obtained. That is to say, since the respective wires are insulated from each other via the gas layers 40, a virtual low-dielectric-constant film having a relative dielectric constant of 1 exists between adjacent wires.

In this embodiment, the dummy opening 30 is formed before the carbon films are removed, and the gas layers 40 are formed by performing ashing with oxygen introduced through the dummy opening 30. Thus, unlike a conventional example, it is no longer necessary to reduce the thickness of an $SiO_2$ film to such a value as to facilitate the passage of oxygen during ashing. That is to say, this structure for a semiconductor device has an advantage in that the interconnection strength between the wires and the plugs can be enhanced by increasing the thicknesses of the upper and lower $SiO_2$ films 9b, 9a. In addition, since the dummy opening 30 is provided, the gas layers 40 surrounding the wires are not encapsulated. Thus, it is possible to eliminate the damage that has conventionally been done on the respective parts of a multilevel interconnect structure because of the expansion and compression of the gas layers 40 during heating and cooling of a semiconductor device.

Moreover, in accordance with this method, it is no longer necessary to repeatedly perform ashing several times, though a conventional method requires the removal of a carbon film every time one interconnect layer is formed. In the method of the present invention, ashing for removing the carbon films needs to be performed only once by forming a dummy opening after all the interconnect layers have been formed. As a result, the process efficiency can also be improved.

In this embodiment, an example of providing three interconnect layers has been described. However, the present invention is not limited thereto, but is naturally applicable to an embodiment where only the first interconnect layer is provided or an embodiment where only the first and second interconnect layers are provided. The present invention is also applicable to an embodiment where multiple layers including a fourth interconnect layer and so on are further provided in addition to the first to third interconnect layers.

Furthermore, in this embodiment, the lower and upper carbon films 10a, 10b, which are removable by ashing with oxygen, and the lower and upper $SiO_2$ films 9a, 9b, which are non-removable by ashing, are used for forming the gas layers 40. Alternatively, any method other than ashing with oxygen may also be used so long as the method enables selective removal. Also, instead of the carbon films 10a, 10b, films made of a material, which can be selectively etched with respect to the $SiO_2$ films 9a, 9b, may also be used as the provisional films. As the case may be, a conductive film may also be used as the provisional film. Moreover, instead of the $SiO_2$ films 9a, 9b, insulating films made of a material, which is not removed by the process for removing the carbon films 10a, 10b, may also be used.

Moreover, instead of the $SiO_2$ film, a film made of a material having an etching stopper function (e.g., a silicon nitride film) may also be used as the substrate coating 7. In such a case, the gate wire 6a and the gate electrode 6 are not etched while the dummy opening 30 is being formed.

The dummy opening 30 is preferably formed at a position on a plane where no wires exist as viewed from the above. The position, where no wires exist, can be easily located based on designing data.

It is not always necessary to form the lower $SiO_2$ films 9a. In such a case, after a single provisional film, integrating the lower and upper provisional films together, has been formed, trenches for wiring and holes are formed in the provisional film.

Embodiment 2

In the first embodiment, the dummy opening 30 is formed to reach and pass through the substrate coating 7. Alternatively, the dummy opening 30 may be formed so as to reach any carbon film 10a or 10b or any $SiO_2$ film 9a or 9b on the way. There are two methods for forming such a dummy opening, as will be described below.

In accordance with the first method, in the regions below the bottom of the dummy opening 30, a silicon dioxide film or the like is formed instead of the gas layer. On the other hand, in accordance with the second method, in the regions below the bottom of the dummy opening 30, the gas layer is formed by utilizing the conventional method.

Figure 2A:
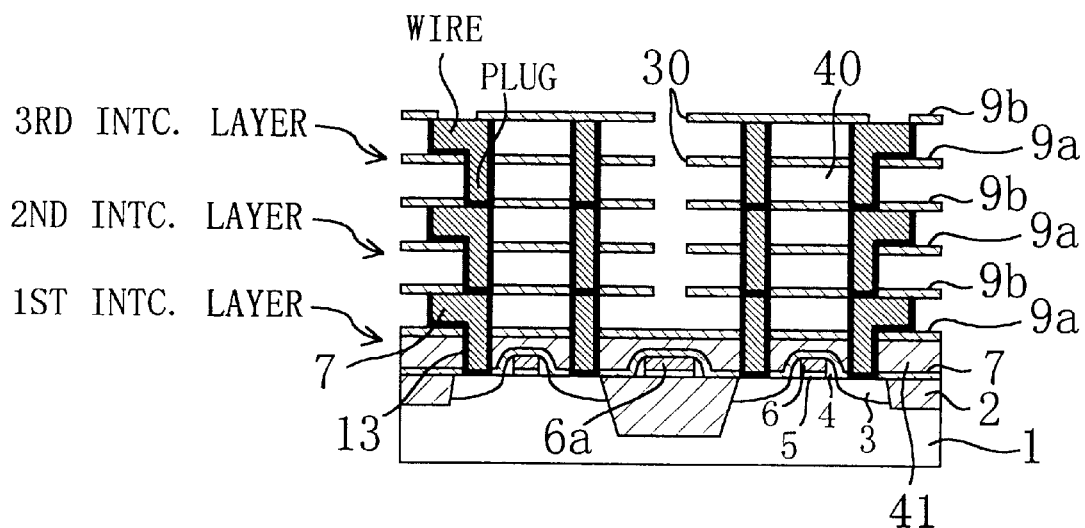
FIG. 2(a) is a cross-sectional view of a semiconductor device having a gas-dielectric interconnect structure with an interlayer dielectric film left in the lowermost layer in the second embodiment of the present invention.

FIG. 2(a) is a cross-sectional view illustrating the structure of a semiconductor device formed in accordance with the first method of this embodiment. An interlayer dielectric film 41, such as a BPSG film, is formed under the first interconnect layer. Only in the regions above the interlayer dielectric film 41, the gas layers 40 are formed to surround the wires and plugs. The structures of the other parts shown in FIG. 2(a) are the same as the counterparts shown in FIG. 1(d).

Such a structure can be formed easily by forming the interlayer dielectric film 41 such as a BPSG film instead of the lower carbon film 10a on the substrate in the step shown in FIG. 1(a), and then performing the same process steps as those illustrated in FIGS. 1(a) through 1(d).

In the structure shown in FIG. 2(a), the portions, where elements such as transistors are formed, can be protected by the interlayer dielectric film 41 with certainty. On the other hand, by providing the gas layers 40 to surround the wires and the plugs above the interlayer dielectric film 41, an interconnect structure having small parasitic capacitance can be obtained in the same way as in the first embodiment. Moreover, since the interlayer dielectric film 41 having a large thickness is provided as the lowermost layer, it is possible to prevent the gate wire and the gate electrode from being etched during the formation of the dummy opening 30.

Figure 2B:
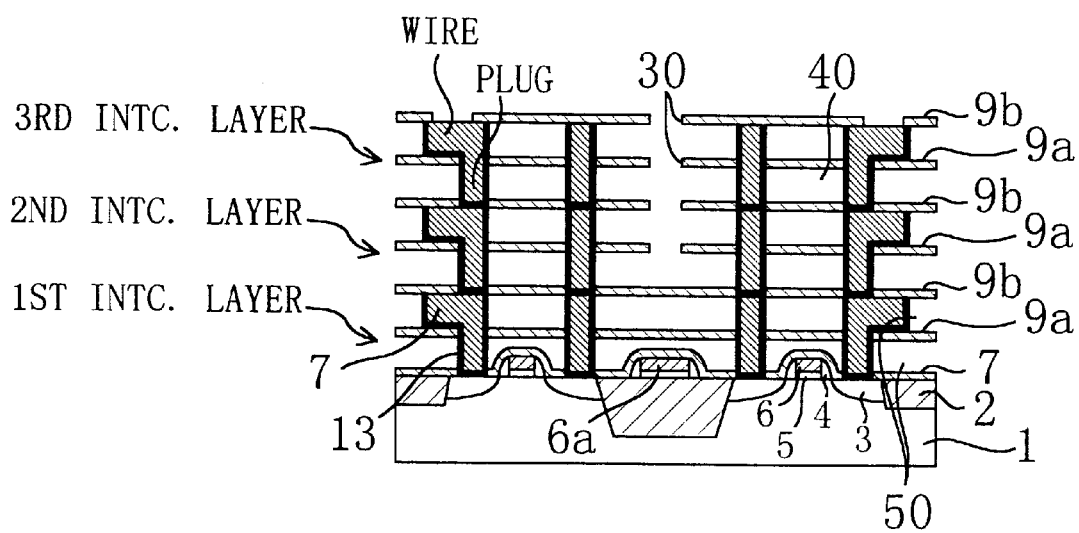
FIG. 2(b) is a cross-sectional view of a semiconductor device having a gas-dielectric interconnect structure with encapsulated spaces left in the lowermost layer in the second embodiment of the present invention.

FIG. 2(b) is a cross-sectional view illustrating the structure of a semiconductor device formed in accordance with the second method of this embodiment. A gas layer 50 having encapsulated spaces is formed to surround the wires and plugs in the first interconnect layer by utilizing the conventional method without allowing the dummy opening to pass through the layer. Only in the regions above the gas layer 50, the same gas layers 40 as those of the first embodiment are formed to surround the wires and plugs. The structures of the other arts shown in FIG. 2(b) are the same as the counterparts shown in FIG. 1(d).

Such a structure can be formed easily by forming another $SiO_2$ film in the state shown in FIG. 1(a), performing ashing with oxygen in such a state and then performing similar process steps as those shown in FIGS. 1(a) through 1(d). In this structure, the dummy opening 30 is usually formed to leave the lowermost pair of lower and upper $SiO_2$ films 9a, 9b. However, when precise control is hard to realize, there is no problem if only the upper $SiO_2$ film 9b or both of the lower and upper $SiO_2$ films 9a, 9b are opened.

In the structure shown in FIG. 2(b), since the dummy opening 30 is not formed in the lowermost pair of $SiO_2$ films 9a, 9b, the portions where elements such as transistors are formed can be protected by the gas layer 50 that is substantially shut off from the external world. In addition, the gas layers 40 communicating with the external world are formed to surround only the wires over the encapsulated portions. As a result, an interconnect structure having small parasitic capacitance can be obtained in the same way as in the first embodiment. Moreover, since it is not necessary to form the dummy opening 30 so as to reach the lowermost layer, it is possible to prevent with certainty the gate wire and the gate electrode from being etched during the formation of the dummy opening 30.

In the first and second methods of this embodiment, the number of the $SiO_2$ films 9a and/or 9b, through which the dummy opening 30 is not formed, is not limited to the ones illustrated in FIG. 2(a) or 2(b). For example, in accordance with the first method, two or more interlayer dielectric films may be formed. In accordance with the second method, it is possible to remove only the lowermost carbon film 10a by the conventional method, i.e., the single-damascene process shown in FIGS. 10(a) and 10(b).

Also, in the same way as in the first embodiment, it is not always necessary to form the lower $SiO_2$ films 9a.

Embodiment 3

Hereinafter, a method for fabricating a semiconductor device of the third embodiment will be described with reference to FIGS. 3(a) through 3(d).

Figure 3A:
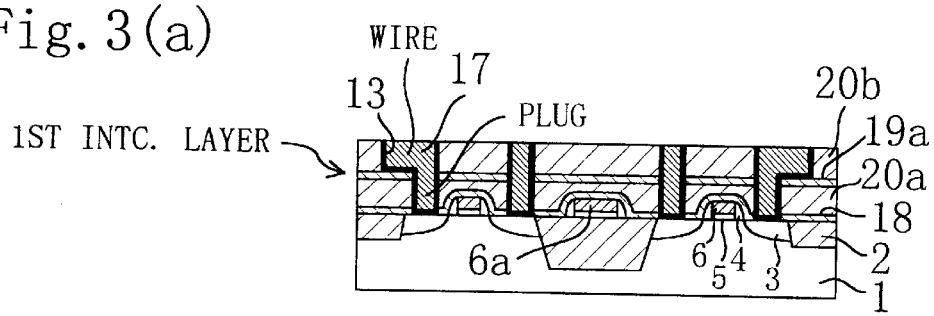
FIGS. 3(a) through 3(d) are cross-sectional views illustrating the respective process steps for fabricating a semiconductor device having a gas-dielectric interconnect structure by using $SiO_2$ films and SiN films in the third embodiment of the present invention.

First, in the process step shown in FIG. 3(a), trench isolation regions 2 are formed in a P-type silicon substrate 1. And MOS transistors, each including source/drain regions 3, sidewalls 4, a gate oxide film 5, a gate electrode 6 and a gate wire 6a, are formed on the substrate. A substrate coating 18, made of SiN, is deposited to cover the gate electrodes 6, the gate wires 6a, the silicon substrate 1 and the like. Then, a lower $SiO_2$ film 20a as a provisional film, a lower SiN film 19a as an insulating film and an upper $SiO_2$ film 20b are sequentially deposited thereon. Next, trenches for wiring are formed in the upper $SiO_2$ film 20b by using the lower SiN film 19a as a stopper. Thereafter, contact holes, each extending from the bottom of a trench to reach the source/drain regions 3 through the lower SiN film 19a and the lower $SiO_2$ film 20a, are opened. Alternatively, the trenches for wiring may be formed after the contact holes have been formed. Subsequently, a barrier metal film and a Cu alloy film are deposited over the entire surface of the substrate by sputtering and then the Cu alloy film is subjected to a heat treatment at a temperature from 400° C. to 500° C. and made to reflow, thereby filling in the trenches for wiring and contact holes with the Cu alloy. Thereafter, the surface of the Cu alloy film is planarized by CMP, thereby removing the deposited barrier metal and Cu alloy films except for the portions filled in the trenches for wiring and contact holes. As a result, portions of the barrier metal film 13 and Cu alloy film 17, which are left in the trenches for wiring, function as the wires for the first interconnect layer. On the other hand, the barrier metal film 13 and Cu alloy film 17, which are left in the contact holes, function as plugs for vertically connecting the wires in the first interconnect layer to the source/drain regions 3.

Figure 3B:
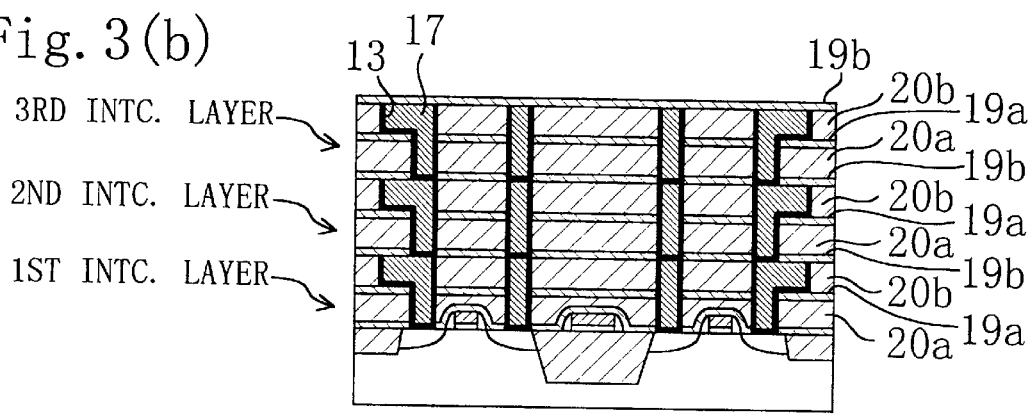

Next, in the process step shown in FIG. 3(b), deposition of upper SiN film 19b, lower $SiO_2$ film 20a, lower SiN film 19a and upper $SiO_2$ film 20b; formation of trenches for wiring and contact holes; and deposition and polishing of barrier metal film 13 and Cu alloy film 17 are repeated several times, thereby forming wires and plugs for the second and third interconnect layers. As the uppermost layer, an upper SiN film 19b, also functioning as a protective film, is deposited.

Figure 3C:
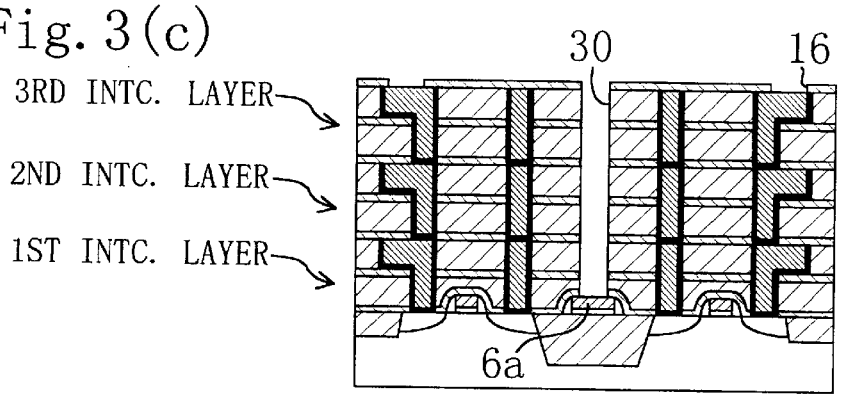

Then, in the process step shown in FIG. 3(c), openings 16 are formed in the uppermost SiN film 19b, thereby exposing pad portions of the Cu alloy film 17 functioning as the wires of the third interconnect layer (the uppermost interconnect layer). Also, a dummy opening 30 is formed to pass through multiple lower and upper $SiO_2$ films 20a, 20b, multiple lower and upper SiN films 19a, 19b and the substrate coating 18 and to reach the gate wire 6a over the trench isolation region 2. Specifically, in this embodiment, the position where the dummy opening 30 is formed is determined to reach the gate wire 6a over the trench isolation region 2. If the dummy opening 30 is formed over a trench isolation region 2 where no gate wire 6a exists, then the trench isolation region 2, made of the same material as that of the respective $SiO_2$ films 20a, 20b, is possibly etched. Thus, it is preferable to form the dummy opening 30 over the gate wire 6a.

Figure 3D:
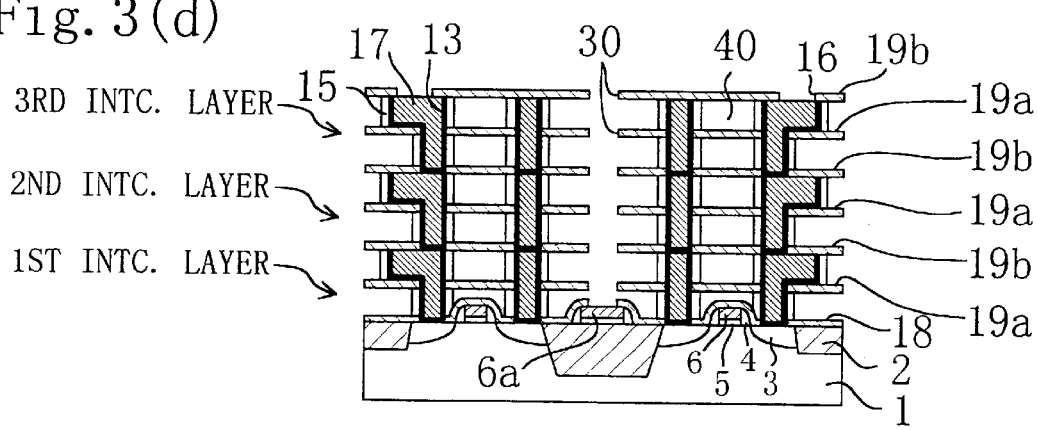

Subsequently, in the process step shown in FIG. 3(d), the lower and upper $SiO_2$ films 20a, 20b are etched with an HF aqueous solution. In this process step, since Cu is not etched by the HF aqueous solution, the wires and contact portions are not etched but left. In this manner, a semiconductor device having a so-called "gas-dielectric interconnect structure" can be obtained. That is to say, since the respective wires are insulated from each other via the gas layers 40, a virtual low-dielectric-constant film having a relative dielectric constant of 1 exists between adjacent wires.

Thereafter, a coating insulating film 15, made of $SiO_2$, for example, is formed over the exposed surfaces of the barrier metal film 13 and gate electrodes 6 by a selective CVD process, for example.

In accordance with the fabrication process of this embodiment, wet etching is performed through the dummy opening 30, and pairs of SiN films and $SiO_2$ films, which can be mass-produced by a CVD process, are used. Thus, the lower and upper SiN films 19a, 19b can be thicker, and therefore, the interconnection strength of the wires can be advantageously increased.

In addition, the surfaces of the wires, made of the barrier metal film 13 and the Cu alloy film 17, are not exposed but covered with the coating insulating film 15. Thus, the relative dielectric constant of the material surrounding the wires becomes slightly higher as compared with the semiconductor device having the gas-dielectric interconnect structure of the first embodiment. However, in this embodiment, even when moisture or humidity penetrates, inconveniences resulting from shortcircuit and erosion can be eliminated. As a result, an even more reliable interconnect structure can be obtained. Such a coating insulating film 15 may be optionally formed in the first or second embodiment.

In this embodiment, in order to form the gas layers 40, the $SiO_2$ films 20a, 20b, which can be removed by wet etching with an HF aqueous solution, and the SiN films 19a, 19b, which cannot be removed by wet etching, are used in combination. Alternatively, any method other than wet etching may also be used so long as the method enables selective removal. In particular, isotropic dry etching may be employed if the selectivity thereof is set high.

Also, instead of the $SiO_2$ films 20a, 20b, films made of a material, which can be selectively etched with respect to the SiN films 19a, 19b, may also be used as the provisional films. As the case may be, a conductive film may also be used as the provisional film. Moreover, instead of the SiN films 19a, 19b, insulating films made of a material, which is not removed by the process for removing the $SiO_2$ films 20a, 20b, may also be used.

In this embodiment, the dummy opening 30 is formed to pass through the substrate coating 18. Alternatively, the dummy opening 30 may be formed to reach any $SiO_2$ film 20a or 20b or any SiN film 19a or 19b on the way, and the gas layers 40 may be formed in the regions between the wires that are located over the selected film. That is to say, a similar structure to that of the second embodiment may be employed.

In the same way in the first embodiment, it is not always necessary to form the lower SiN films 19a.

Embodiment 4

Hereinafter, a method for fabricating a semiconductor device in the fourth embodiment will be described with reference to FIGS. 4(a) through 4(c).

Figure 4A:
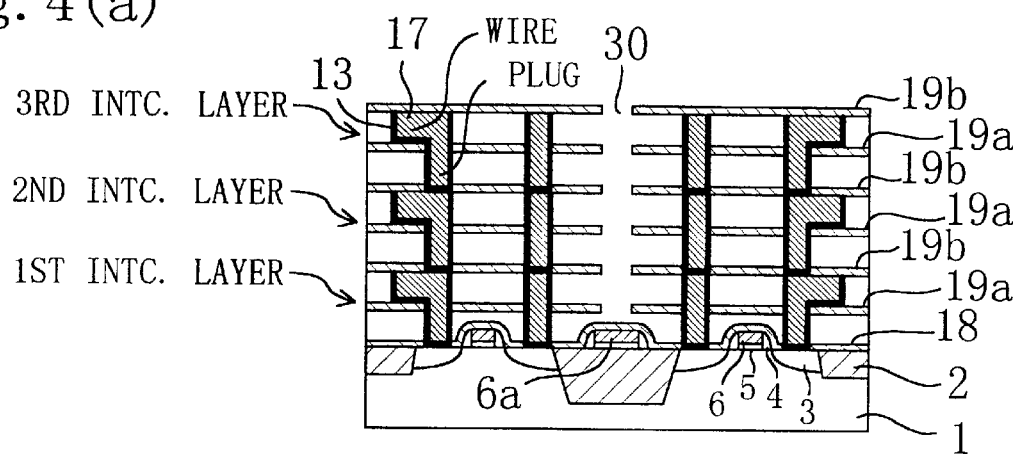
FIGS. 4(a) through 4(c) are cross-sectional views illustrating the respective process steps for fabricating a semiconductor device having a gas-dielectric interconnect structure by filling in the gas layers thereof with a low-dielectric-constant film in the fourth embodiment of the present invention.

First, in the process step shown in FIG. 4(a), the same process steps as those illustrated in FIGS. 3(a) through 3(d) of the third embodiment are performed. As a result, trench isolation regions 2, and MOS transistors, each including source/drain regions 3, sidewalls 4, a gate oxide film 5, a gate electrode 6 and a gate wire 6a, have been formed on the substrate. A multilevel interconnect structure including wires and plugs, each made of a barrier metal film 13 and a Cu alloy film 17, has been formed over the substrate and supported by three lower SiN films 19a and three upper SiN films 19b. Also, a dummy opening 30 has been formed to extend from the uppermost SiN film 19b, pass through the respective SiN films 19a, 19b and the substrate coating 18 and reach the gate wire 6a. Air layers 40 have also been formed to surround the wires and plugs. That is to say, a semiconductor device having a gas-dielectric interconnect structure has already been formed at this point in time.

Figure 4B:
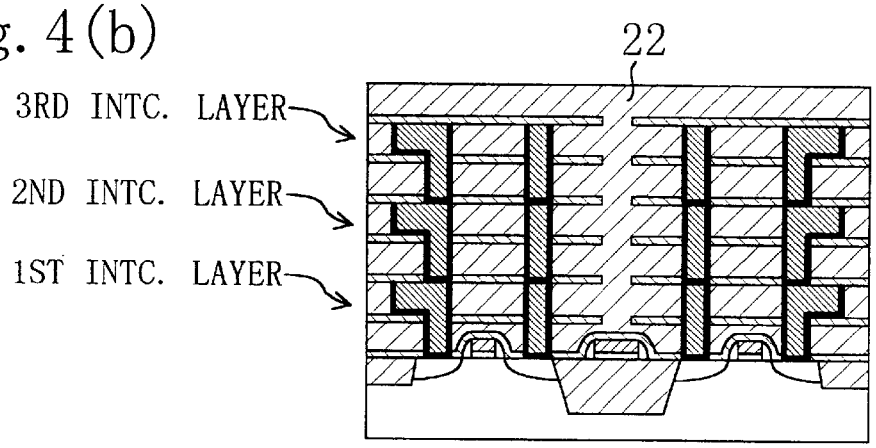

Next, in the process step shown in FIG. 4(b), a low-dielectric-constant material having a relative dielectric constant of 2.8 or less is injected through the dummy opening 30, thereby filling in the gas layers 40, which exist in the state shown in FIG. 4(a), with the low-dielectric-constant material. As a result, a low-dielectric-constant film 22 is formed. For example, a cytop film (relative dielectric constant: 2.1), which is an organic coating, may be roll-coated and then the coating may be baked if necessary.

Figure 4C:
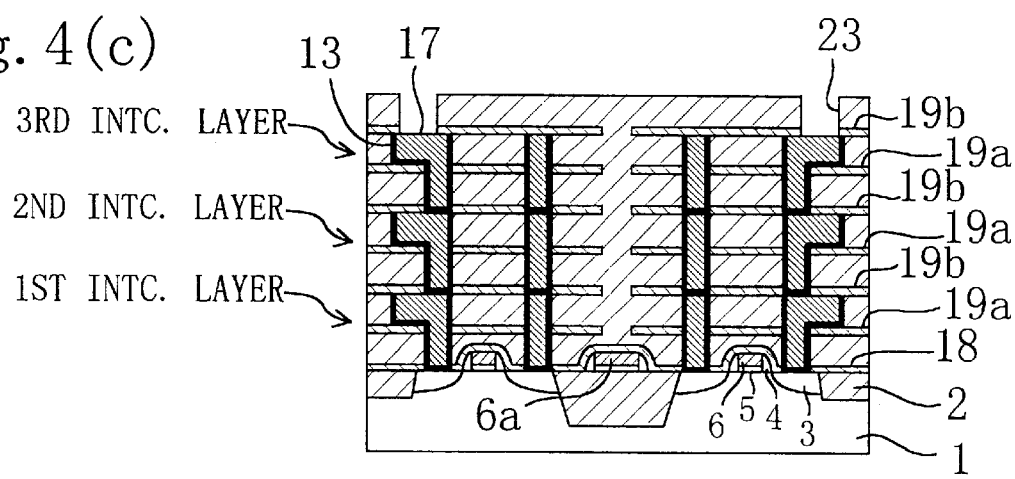

Finally, in the process step shown in FIG. 4(c), openings 23 are formed in the low-dielectric-constant film 22 for exposing the pad portions of the Cu alloy film 17 as the uppermost interconnect layer.

In the interconnect structure of this embodiment, a low-dielectric-constant material is filled in between the wires unlike a so-called gas-dielectric interconnect structure. Thus, the wires are supported by the low-dielectric-constant film 22 and the strength of the multilevel interconnect structure is increased. Specifically, in the fabrication process of this embodiment, Cu wires are formed by filling in the trenches for wiring with a Cu alloy through a heat treatment conducted at a temperature from 400° C. to 450° C., and then the low-dielectric-constant film 22 having a relative dielectric constant of 2.8 or less is filled into the gaps between the Cu wires. Thus, a semiconductor device, having a low-dielectric-constant film that cannot resist to heat of 400° C. to 450° C. and the trench-filling Cu wires, can be formed easily. Thus, though the relative dielectric constant of the structure of this embodiment is higher than that of a gas-dielectric interconnect structure, wiring delay can be reduced with a stable structure. This is because the resistance of the wires and the dielectric constant of the insulating films provided between the wires are further reduced. That is to say, a multilevel interconnect structure having generally optimized properties is realized.

In this embodiment, the low-dielectric-constant film 22 is introduced so as to reach the lowermost one of the three interconnect layers. Alternatively, the dummy opening 30 for introducing the low-dielectric-constant film 22 therethrough may be formed to reach an interconnect layer overlying the lowermost layer, and the low-dielectric-constant film 22 may be filled to reach the selected layer.

In this embodiment, the low-dielectric-constant film 22 is injected. Alternatively, the gas layers 40 may be replaced by the low-dielectric-constant film 22 in accordance with a CVD process. For example, a fluorine-doped amorphous carbon film ($\alpha$-C:F) having a relative dielectric constant of about 2.4 can be formed by performing a plasma CVD process at a temperature of about 350° C. while using $C_4H_8$ and $CH_4$ gases and parallel plate electrode RF plasma.

Embodiment 5

Hereinafter, a method for fabricating a semiconductor device of the fifth embodiment will be described with reference to FIGS. 5(a) through 5(c).

Figure 5A:
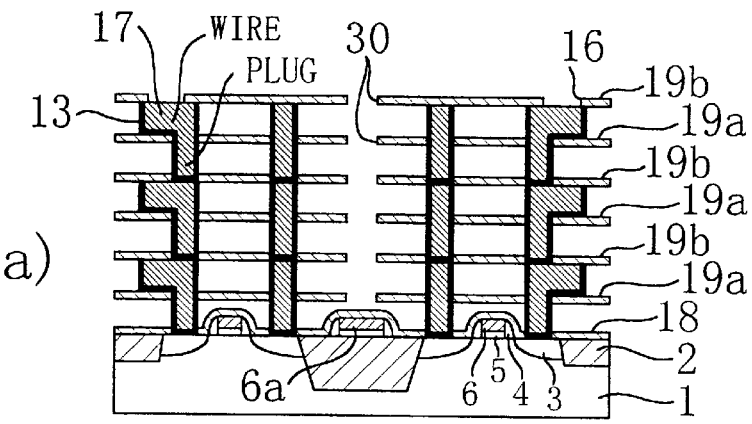
FIGS. 5(a) through 5(c) are cross-sectional views illustrating the respective process steps for fabricating a semiconductor device having a gas-dielectric interconnect structure by connecting bonding wires thereto and then filling in the gas layers thereof with a low-dielectric-constant film in the fifth embodiment of the present invention.

First, in the process step shown in FIG. 5(a), the same process steps as those illustrated in FIGS. 3(a) through 3(d) of the third embodiment are performed. As a result, trench isolation regions 2, and MOS transistors, each including source/drain regions 3, sidewalls 4, a gate oxide film 5, a gate electrode 6 and a gate wire 6a, have been formed on the silicon substrate 1. A multilevel interconnect structure including wires and plugs, each made of a barrier metal film 13 and a Cu alloy film 17, has been formed over the substrate and supported by three lower SiN films 19a and three upper SiN films 19b. Also, a dummy opening 30 has been formed to extend from the uppermost SiN film 19b, pass through the respective SiN films 19a, 19b and the substrate coating 18 and reach the gate wire 6a. Air layers 40 have been formed to surround the wires and the plugs. That is to say, a semiconductor device having a gas-dielectric interconnect structure has already been formed in substantially the same way as the structure shown in FIG. 4(a) of the fourth embodiment. However, this embodiment is different from the fourth embodiment in that openings 16 have been formed in the uppermost SiN film 19b for exposing the pad portions of the Cu alloy film 17 functioning as the wires in the uppermost layer.

Figure 5B:
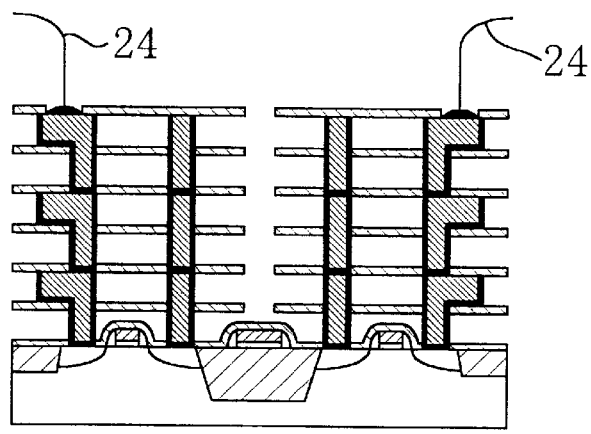

Then, in the process step shown in FIG. 5(b), bonding wires 24 are connected to the uppermost Cu alloy film 17 exposed inside the openings 16.

Figure 5C:
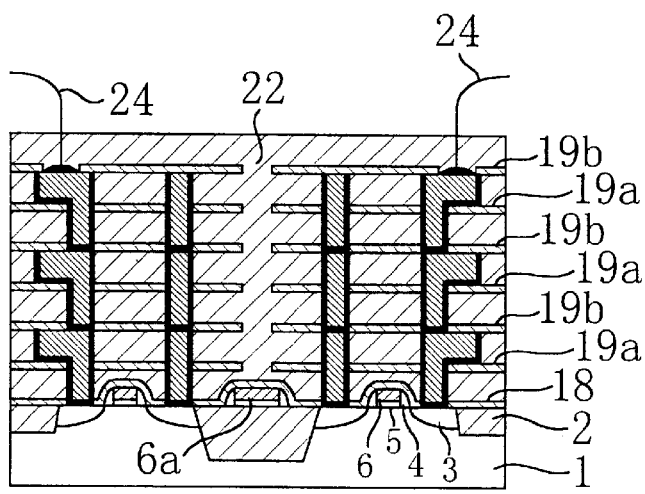

Next, in the process step shown in FIG. 5(c), a low-dielectric-constant material having a relative dielectric constant of 2.8 or less is injected through the dummy opening 30 that has been provided to extend from the uppermost to the lowermost interconnect layer. In this manner, the gas layers, which exist in the state shown in FIG. 5(a), are filled in with the low-dielectric-constant material, thereby forming a low-dielectric-constant film 22. For example, a cytop film (relative dielectric constant: 2.1), which is an organic coating, may be roll-coated and then the coating may be baked if necessary.

In accordance with the fabrication process of this embodiment, the wires are also supported by the low-dielectric-constant film 22. Thus, a semiconductor device, attaining the same effects as those of the third embodiment, can also be formed. In addition, a semiconductor device, having a low-dielectric-constant film that cannot resist to heat of 400° C. to 450° C. and the trench-filling Cu wires, can also be formed easily.

Moreover, in accordance with the fabrication process of this embodiment, the openings 16 for exposing the pad portions of the uppermost Cu alloy film 17 have already been formed in the uppermost SiN film 19b in the process step shown in FIG. 5(a). Thus, unlike the third embodiment, it is not necessary to form contact holes in the uppermost interconnect layer after the low-dielectric-constant film 22 having a relative dielectric constant of 2.8 or less has been introduced to fill in the gaps between the Cu wires.

In this embodiment, the low-dielectric-constant film 22 is introduced so as to reach the lowermost one of the three interconnect layers. Alternatively, the dummy opening 30 for introducing the low-dielectric-constant film 22 therethrough may be formed to reach an interconnect layer overlying the lowermost layer, and the low-dielectric-constant film 22 may be filled to reach the layer.

In the same way in the first embodiment, it is not always necessary to form the lower SiN films 19a.

Embodiment 6

Next, a method for fabricating a semiconductor device of the sixth embodiment, in which interconnect layers are not formed by the damascene process employed in the foregoing embodiments but by etching and patterning a metal film in a general manner, will be described.

FIGS. 6(a) through 6(c) and FIGS. 7(a) and 7(b) are cross-sectional views illustrating the process steps for fabricating the semiconductor device of this embodiment.

Figure 6A:
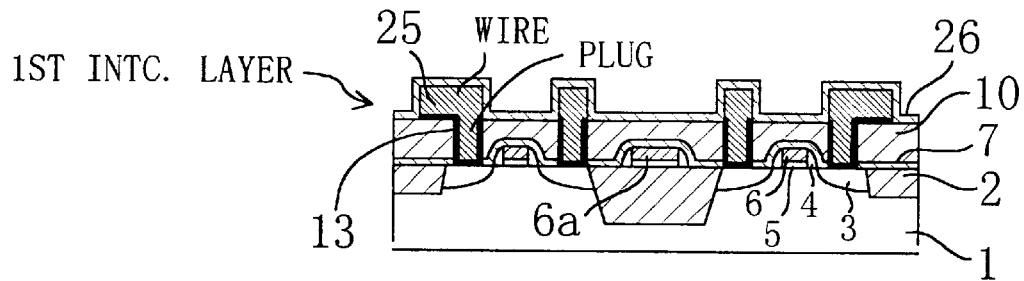
FIGS. 6(a) through 6(c) are cross-sectional views illustrating the first-half process steps for fabricating a semiconductor device having a gas-dielectric interconnect structure by etching and patterning a metal film until a multilevel interconnect structure is formed in the sixth embodiment of the present invention.

First, in the process step shown in FIG. 6(a), trench isolation regions 2 are formed in a P-type silicon substrate 1. Then, MOS transistors, each including source/drain regions 3, sidewalls 4, a gate oxide film 5, a gate electrode 6 and a gate wire 6a, are formed on the substrate. A substrate coating 7, made of $SiO_2$, for covering the gate electrodes 6, the gate wires 6a, the silicon substrate 1 and the like is formed thereon. And, a carbon film 10 as a provisional film and an $SiO_2$ film 9 are sequentially deposited thereon. Then, contact holes, each reaching the source/drain regions 3 through the $SiO_2$ film 9 and the carbon film 10, are opened. Subsequently, a barrier metal film and an aluminum (Al) alloy film are deposited over the entire surface of the substrate by sputtering and patterned. As a result, the barrier metal film 13 and the Al alloy film 25 on the carbon film 10 function as the wires of the first interconnect layer. Also, the portions of the barrier metal film 13 and the Al alloy film 25, which are left in the contact holes, function as the plugs for vertically connecting the wires in the first interconnect layer to the source/drain regions 3.

Figure 6B:
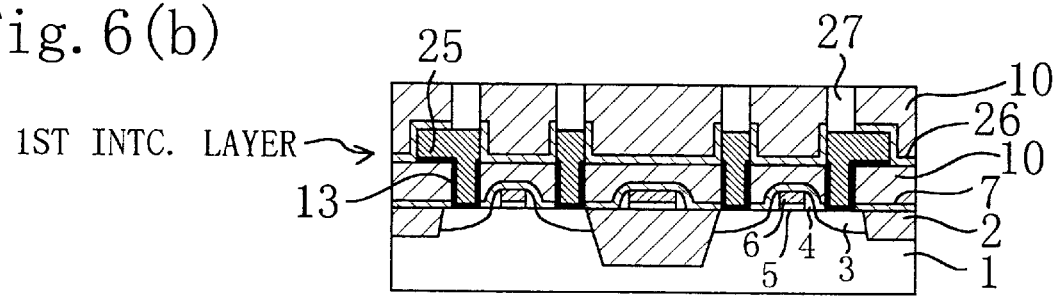

Next, in the process step shown in FIG. 6(b), an $SiO_2$ film 26 is deposited over the entire surface of the substrate. In this case, the $SiO_2$ film 26 is formed to cover the upper and side surfaces of the carbon film 10 and the Al alloy film 25. Then, a carbon film 10 is further deposited thereon. Subsequently, through holes 27 are formed to pass through the carbon film 10 and the $SiO_2$ film 26 and reach the Al alloy film 25.

Figure 6C:
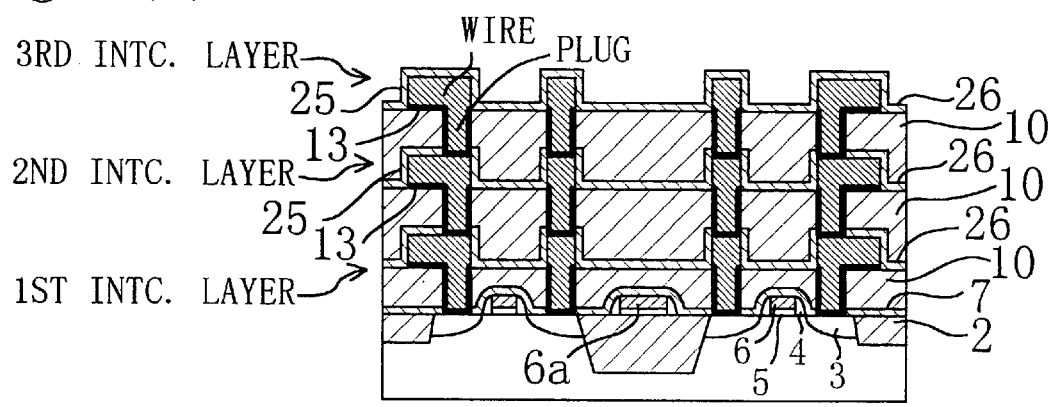

Next, in the process step shown in FIG. 6(c), deposition and patterning of barrier metal films 13 and Al alloy films 25 and deposition of carbon films 10 and $SiO_2$ films 26 are repeated several times, thereby forming wires and plugs for the second and third interconnect layers. As the uppermost layer, an $SiO_2$ film 26, also functioning as a protective film, is deposited.

Figure 7A:
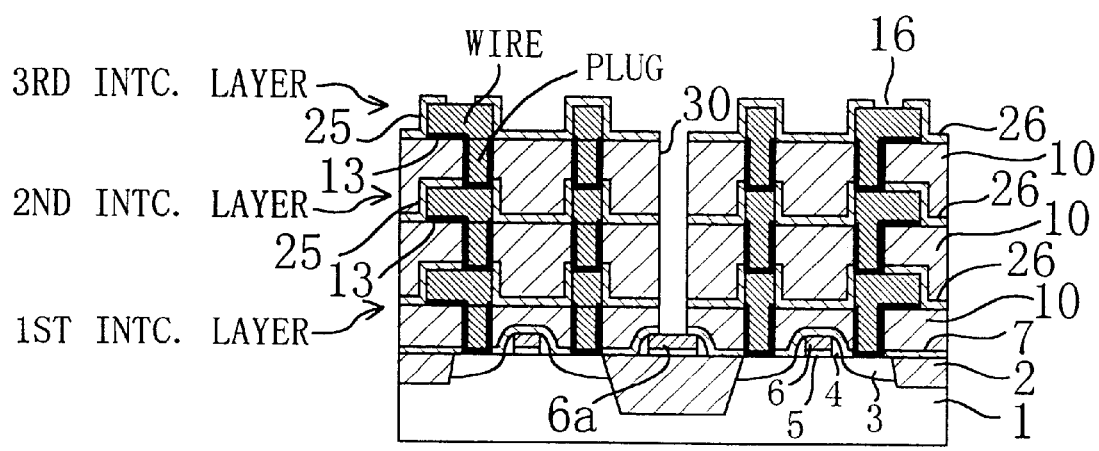
FIGS. 7(a) and 7(b) are cross-sectional views illustrating the second-half process steps for fabricating the semiconductor device having the gas-dielectric interconnect structure by etching and patterning a metal film after the multilevel interconnect structure has been formed in the sixth embodiment.

Then, in the process step shown in FIG. 7(a), openings 16 are formed through the uppermost $SiO_2$ film 26, thereby exposing pad portions of the Al alloy film 25 functioning as the wires of the third interconnect layer (the uppermost interconnect layer). Also, a dummy opening 30 is formed to pass through multiple carbon films 10, multiple $SiO_2$ films 26 and the substrate coating 7 and to reach the gate wire 6a over the trench isolation region 2.

Figure 7B:
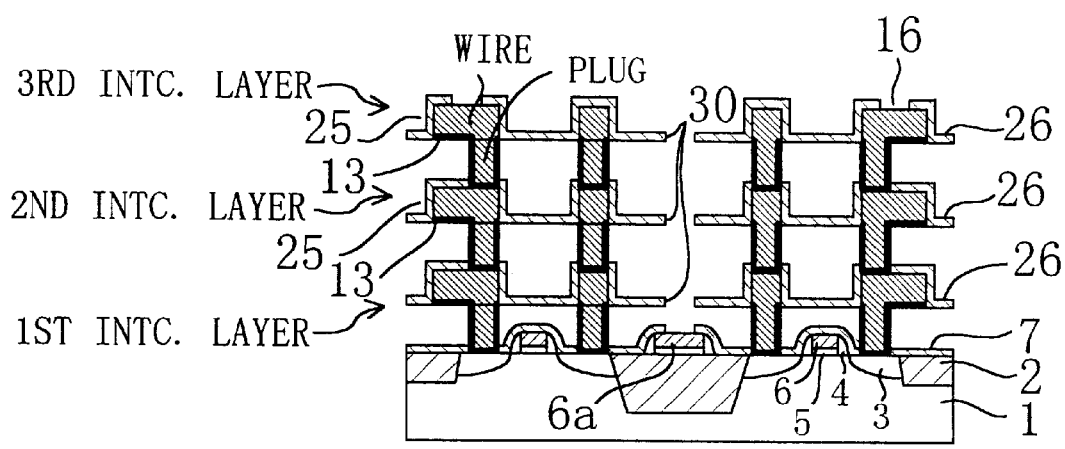

Subsequently, in the process step shown in FIG. 7(b), the carbon films 10 are removed by ashing with oxygen. As a result, gas layers 40 are formed between the wires, each made of the barrier metal film 13 and the Al alloy film 25. In this manner, a semiconductor device having a so-called "gas-dielectric interconnect structure" can be obtained. That is to say, since the respective wires are insulated from each other via the gas layers 40, a virtual low-dielectric-constant film having a relative dielectric constant of 1 exists between adjacent wires.

In accordance with this embodiment, the same effects as those of the first embodiment can be attained in terms of the structure and the fabrication process. In addition, this embodiment can utilize a generally employed process for forming an interconnect layer by etching and patterning a metal film. Moreover, since the contact area between the Al alloy film 25 and the $SiO_2$ film 26 is large, the function of the $SiO_2$ film 26 interconnecting the Al alloy film 25 can be enhanced.

In this embodiment, the principal portion of the wires and plugs is made of the same metal material, i.e., an aluminum alloy. Alternatively, the wires and plugs may be made of different materials, for example, an aluminum alloy and tungsten, respectively.

The method of this embodiment may also employ the structure of the second embodiment shown in FIGS. 2(a) and 2(b) where the lowermost layer is filled with the interlayer dielectric film 41 or has the encapsulated gas layers 50 left. The method of this embodiment may use $SiO_2$ films as films to be removed and SiN films as insulating film to be left as in the third embodiment. Or the method of this embodiment may replace the gas layers 40 with the low-dielectric-constant film 22 as in the fourth embodiment.

In this embodiment, only the $SiO_2$ film 26 is provided to come into contact with the upper and side surfaces of the Al alloy film 25 functioning as the wires of each interconnect layer. However, in the case of forming an interconnect layer by etching and patterning a metal film, a planar insulating film may be formed so as to come into contact with the lower surface of the metal film and interconnect the metal film. Such an insulating film may be formed by the methods of the following modified embodiments.

Modified Embodiment 1

Figure 8:
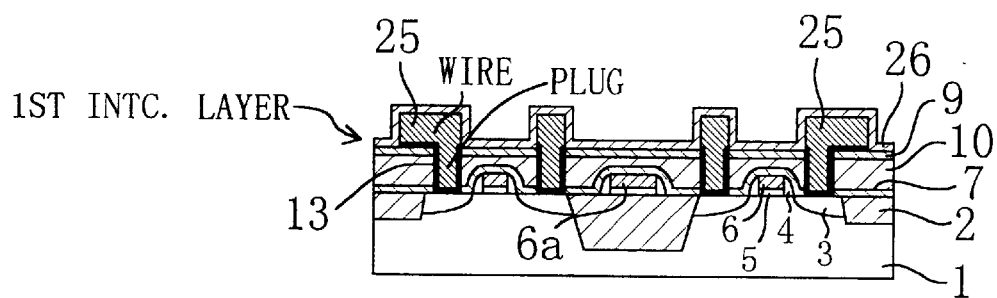
FIG. 8 is a cross-sectional view illustrating the structure of a semiconductor device in the first variation of the sixth embodiment by using a structure in which an interconnect layer is being formed.

FIG. 8 is a cross-sectional view illustrating a part of the process (a process step corresponding to that shown in FIG. 7(a)) for fabricating a semiconductor device in the first variation of the sixth embodiment. As shown in FIG. 8, a planar $SiO_2$ film 9 is formed on the carbon film 10 and then formation of contact holes and deposition of the barrier metal film and the Al alloy film may be performed. After the barrier metal film 13 and the Al alloy film 25 have been formed, the $SiO_2$ film 26 is deposited over the substrate. In the structure shown in FIG. 8, the Al alloy film 25 is interconnected so as to be wrapped by the $SiO_2$ films 9 and 26 in all the directions. Thus, the Al alloy film 25 can be interconnected very strongly by the $SiO_2$ films 9 and 26.

Modified Embodiment 2

Figure 9:
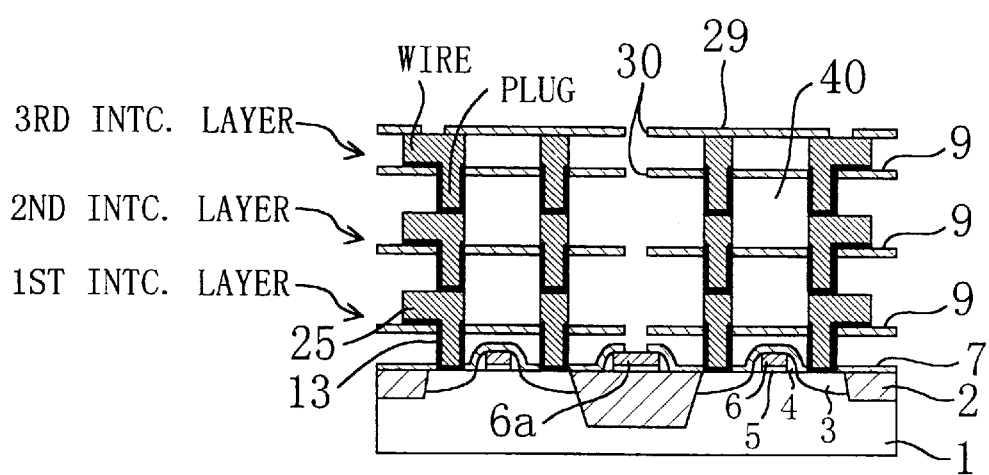
FIG. 9 is a cross-sectional view illustrating the structure of a semiconductor device in the second variation of the sixth embodiment.
Figure 12A:
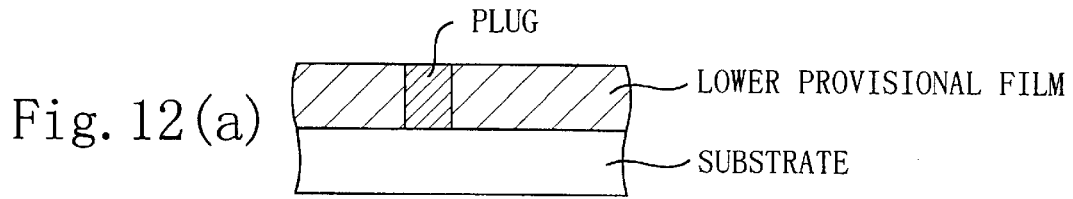
FIGS. 12(a) through 12(d) are cross-sectional views illustrating the process steps utilizing single damascene technique in the first or third embodiment of the present invention.
Figure 12B:
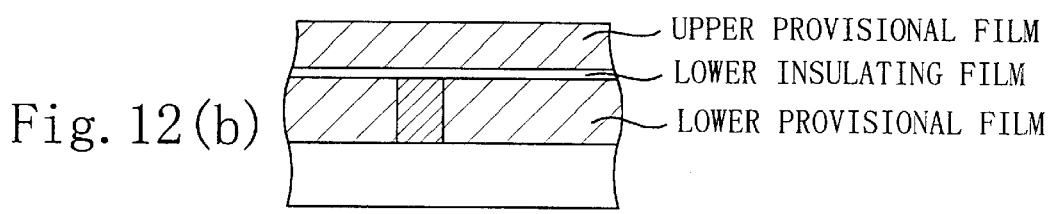
Figure 12C:
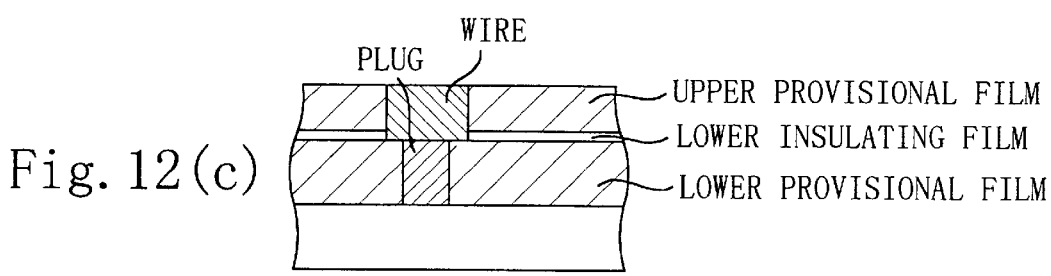
Figure 12D:
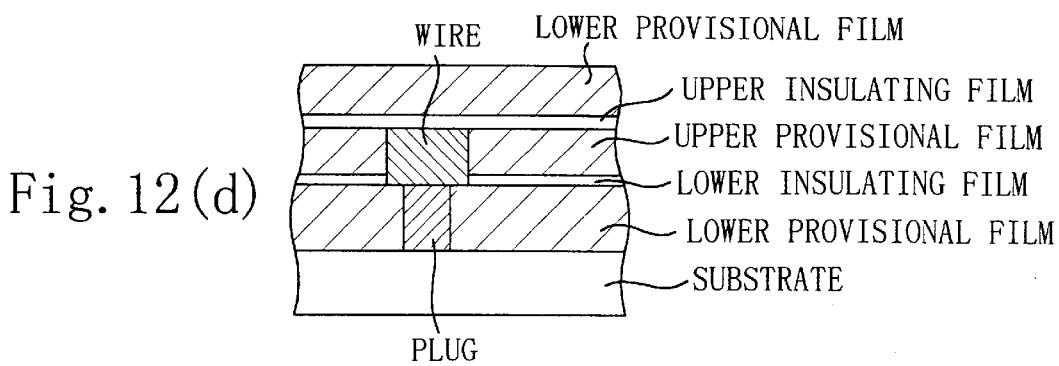

FIG. 9 is a cross-sectional view illustrating a structure for a semiconductor device in the second variation of the sixth embodiment. As shown in FIG. 9, a planar $SiO_2$ film 9 is provided on the carbon film 10, but the $SiO_2$ film 26 such as that shown in FIG. 8 is not provided. This structure can be formed by performing the steps of: forming the planar $SiO_2$ film 9 on the carbon film 10; forming the contact holes; and depositing and patterning the barrier metal film and the Al alloy film. As a matter of principle, the $SiO_2$ film 26 is not deposited on the Al alloy film 25. However, an $SiO_2$ film 29 is deposited as a protective film over only the Al alloy film 25 in the uppermost interconnect layer.

The structure shown in FIG. 9 can also interconnect the Al alloy film 25 strongly with the $SiO_2$ film 9 if the thickness of the $SiO_2$ film 9 is set at a sufficiently large value.

Other Embodiments

In the foregoing embodiments, a pair of single layers, e.g., carbon film and $SiO_2$ film or $SiO_2$ film and SiN film, is used as a combination of provisional film and insulating film. At least one of the pair of films may be a multilayer film.

Various passive elements such as resistors and capacitors, diodes and the like may be formed on the silicon substrate 1.

In each embodiment, MOS transistors, each including a trench isolation region 2, source/drain regions 3, sidewalls 4, a gate oxide film 5, a gate electrode 6 and a gate wire 6a, are formed on the silicon substrate 1. Other types of transistors such as bipolar transistors may be formed instead of or in addition to the MOS transistors.

In the foregoing embodiments, the substrate coating 7 or 18, made of $SiO_2$ or SiN, is provided. However, the substrate coating 7 or 18 may be omitted so long as the carbon films 10a, 10b or the $SiO_2$ films 20a, 20b can be removed without doing any damage on the silicon substrate 1 and the gate electrodes 6.

In the foregoing embodiments, a Cu alloy is used as a material for the wires. Alternatively, a any conductive material other than Cu, e.g., a metal such as Al or an alloy thereof, may also be used. The barrier metal film 13 may be omitted.

There are various materials having relative dielectric constants lower than 2.8: organic SOG (relative dielectric constant: about 2.8), fluorine-added polyimide (relative dielectric constant: about 2.7), polyarylether fluoride (relative dielectric constant: about 2.6), parylene-F (relative dielectric constant: about 2.4), cytop (relative dielectric constant: about 2.1), Teflon-AF (relative dielectric constant: 1.9 to 2.1), HSQ (relative dielectric constant: 2.2 to 2.7), PAE (relative dielectric constant: about 2.43) and BCB (relative dielectric constant: about 2.7). Any of these materials may be used depending upon the necessity.

In each of the drawings, only one dummy opening is illustrated. However, as many dummy openings as possible are preferably formed so long as the openings can afford to be formed.

In the first to the fourth embodiments, trenches for wiring and holes are formed and then wires and plugs are simultaneously formed in accordance with a so-called "dual-damascene process". Alternatively, a so-called "single-damascene process", in which formation of holes and plugs and formation of trenches for wiring and wires are performed separately, may be naturally employed.

FIGS. 12(*a*) through 12(*d*) are cross-sectional views illustrating the process steps for forming interconnect layers by utilizing the single damascene technique.

First, in the process step shown in FIG. 12(*a*), a lower provisional film is deposited on a substrate, a hole is formed in the lower provisional film, and then the hole is filled in with a conductive material, thereby forming a plug. The substrate may be either a semiconductor substrate or a structure in which an interconnect layer has already been formed on a semiconductor substrate. The lower provisional film is a member corresponding to the lower carbon film 10*a* of the first embodiment or the lower SiO$_2$ film 20*a* of the third embodiment.

Next, in the process step shown in FIG. 12(*b*), a lower insulating film and an upper provisional film are deposited on the substrate. The lower insulating film is a member corresponding to the lower SiO$_2$ film 9*a* of the first embodiment or the lower SiN film 19*a* of the third embodiment. The upper provisional film is a member corresponding to the upper carbon film 10*b* of the first embodiment or the upper SiO$_2$ film 20*b* of the third embodiment.

Then, in the process step shown in FIG. 12(*c*), a trench for wire is formed in the upper provisional film, and the trench for wire is filled in with a conductive material, thereby forming a wire.

Subsequently, in the process step shown in FIG. 12(*d*), an upper insulating film and a lower provisional film are sequentially stacked on the substrate. The upper insulating film is a member corresponding to the upper SiO$_2$ film 9*b* of the first embodiment or the upper SiN film 19*b* of the third embodiment. The subsequent process steps are the same as the counterparts of the above-described first and third embodiments, and therefore, the description and illustration thereof will be omitted herein. A plug for the next interconnect layer is formed in the uppermost lower provisional film shown in FIG. 12(*d*).

A gas-dielectric interconnect structure, attaining the same effects as those of the first and third embodiments, can also be formed in accordance with the single damascene process shown in FIGS. 12(*a*) through 12(*d*). This single damascene process is particularly effective to a semiconductor device with an even higher density, in which a hole has an even higher aspect ratio.

What is claimed is:

1. A semiconductor device comprising:

a semiconductor substrate;

a plurality of interconnect layers disposed at respectively different levels above the semiconductor substrate, each said interconnect layer including a plurality of wires;

a plurality of plugs, each said plug vertically connecting an associated wire in one of the interconnect layers to the semiconductor substrate or vertically connecting a pair of wires to each other, the pair of wires belonging to two mutually different ones of the interconnect layers;

a plurality of insulating films provided for the respective interconnect layers, each said insulating film being in contact with the respective wires belonging to the same one of the interconnect layers, and laterally connecting the wires to each other; and an opening provided to pass through at least the uppermost one of the insulating films, wherein regions immediately under each said insulating film, through which the opening is formed, form a gas layer, and regions overlying the regions immediately under each said insulating film and surrounding the wires and the plugs also form a gas layer.

2. The semiconductor device of claim 1, wherein a pair of said insulating films are provided for each said interconnect layer so as to come into contact with the upper and lower surfaces of the wires in each said interconnect layer.

3. The semiconductor device of claim 1, further comprising coating insulating films formed on exposed surfaces of the wires and the plugs.

4. A semiconductor device comprising:

a semiconductor substrate;

a plurality of interconnect layers disposed at respectively different levels above the semiconductor substrate, each said interconnect layer including a plurality of wires;

a plurality of plugs, each said plug vertically connecting an associated wire in one of the interconnect layers to the semiconductor substrate or vertically connecting a pair of wires to each other, the pair of wires belonging to two mutually different ones of the interconnect layers;

a plurality of first insulating films provided for the respective interconnect layers, each said first insulating film being in contact with the respective wires belonging to the same one of the interconnect layers and laterally connecting the wires to each other; and an opening provided to pass through at least the uppermost one of the first insulating films, wherein regions immediately under each said insulating film, through which the opening is formed, and regions overlying the regions immediately under each said insulating film and surrounding the wires and the plugs are filled with a low-dielectric-constant film having a relative dielectric constant of 2.8 or less.

* * * * *